United States Patent
Choi et al.

(10) Patent No.: US 7,867,924 B2
(45) Date of Patent: Jan. 11, 2011

(54) METHODS OF REDUCING IMPURITY CONCENTRATION IN ISOLATING FILMS IN SEMICONDUCTOR DEVICES

(75) Inventors: Jong-wan Choi, Gyeonggi-do (KR); Eun-kyung Baek, Gyeonggi-do (KR); Sang-hoon Ahn, Gyeonggi-do (KR); Hong-gun Kim, Gyeonggi-do (KR); Dong-chul Suh, Gyeonggi-do (KR); Yong-soon Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 417 days.

(21) Appl. No.: 12/038,278

(22) Filed: Feb. 27, 2008

(65) Prior Publication Data

US 2008/0206954 A1    Aug. 28, 2008

(30) Foreign Application Priority Data

Feb. 27, 2007    (KR) .................. 10-2007-0019879

(51) Int. Cl.
H01L 21/4763    (2006.01)

(52) U.S. Cl. ............ 438/795; 257/E21.17; 257/E21.28; 257/E21.584; 257/E23.019; 257/E23.144; 257/329; 257/330; 257/331; 257/341; 438/424; 438/672; 438/619; 438/99; 438/22

(58) Field of Classification Search ............... 438/795
See application file for complete search history.

(56) References Cited

U.S. PATENT DOCUMENTS

| | | | | |
|---|---|---|---|---|
| 5,492,851 A * | 2/1996 | Ryou | ........................ | 438/152 |
| 5,504,022 A * | 4/1996 | Nakanishi et al. | ........... | 438/594 |
| 5,556,806 A * | 9/1996 | Pan et al. | ..................... | 438/624 |
| 5,663,092 A * | 9/1997 | Lee | ............................ | 438/253 |
| 5,770,482 A * | 6/1998 | Kadosh et al. | .............. | 438/152 |
| 5,888,853 A * | 3/1999 | Gardner et al. | .............. | 438/152 |
| 6,075,268 A * | 6/2000 | Gardner et al. | .............. | 257/327 |
| 6,165,543 A * | 12/2000 | Otsuki et al. | .................. | 427/66 |
| 6,599,847 B1 * | 7/2003 | Jang et al. | .................... | 438/787 |
| 6,624,469 B1 * | 9/2003 | Harada | ....................... | 257/330 |
| 6,746,918 B2 * | 6/2004 | Wu | ............................ | 438/257 |
| 6,781,162 B2 * | 8/2004 | Yamazaki et al. | ........... | 257/184 |
| 7,056,753 B2 * | 6/2006 | Lee et al. | ...................... | 438/20 |
| 7,064,405 B2 * | 6/2006 | Kondo et al. | ................ | 257/436 |
| 7,091,088 B1 * | 8/2006 | Cheng et al. | ................ | 438/257 |

(Continued)

FOREIGN PATENT DOCUMENTS

KR    1019910008980 B1    10/1991

(Continued)

*Primary Examiner*—Fernando L Toledo
*Assistant Examiner*—Ankush k Singal
(74) *Attorney, Agent, or Firm*—Myers Bigel Sibley & Sajovec, P.A.

(57) ABSTRACT

A method of fabricating a semiconductor device includes forming a lower device on a lower semiconductor substrate, and forming an interlayer insulating film on the lower device. An upper semiconductor substrate is formed on the interlayer insulating film such that the interlayer insulating film is between the lower and upper semiconductor substrates. Upper trenches are formed within the upper semiconductor substrate. An upper device isolating film is formed within the upper trenches. The upper device isolating film is irradiated with ultraviolet light having a wavelength configured to break chemical bonds of impurities in the upper device isolating film to reduce an impurity concentration thereof.

19 Claims, 3 Drawing Sheets

U.S. PATENT DOCUMENTS

| | | | |
|---|---|---|---|
| 7,351,656 B2 * | 4/2008 | Sakata et al. | 438/672 |
| 7,486,368 B2 * | 2/2009 | Sakakura et al. | 349/153 |
| 2001/0048494 A1 * | 12/2001 | Koma | 349/110 |
| 2002/0132464 A1 * | 9/2002 | Lee | 438/618 |
| 2003/0076461 A1 * | 4/2003 | Liu et al. | 349/113 |
| 2003/0148062 A1 * | 8/2003 | Solomon et al. | 428/103 |
| 2003/0227021 A1 * | 12/2003 | Yamazaki et al. | 257/83 |
| 2003/0232472 A1 * | 12/2003 | Wu | 438/257 |
| 2004/0226827 A1 * | 11/2004 | Matsuda et al. | 205/123 |
| 2005/0142806 A1 * | 6/2005 | Song | 438/424 |
| 2005/0264168 A1 * | 12/2005 | Lee | 313/496 |
| 2005/0272220 A1 | 12/2005 | Waldfried et al. | |
| 2006/0094183 A1 * | 5/2006 | Wieczorek et al. | 438/202 |
| 2006/0128250 A1 * | 6/2006 | Kim et al. | 445/24 |
| 2006/0211235 A1 * | 9/2006 | Usami | 438/618 |

FOREIGN PATENT DOCUMENTS

| | | |
|---|---|---|
| KR | 1020050012040 A | 1/2005 |

* cited by examiner

METHODS OF REDUCING IMPURITY CONCENTRATION IN ISOLATING FILMS IN SEMICONDUCTOR DEVICES

CROSS-REFERENCE TO RELATED PATENT APPLICATIONS

This application claims priority from Korean Patent Application No. 10-2007-0019879, filed on Feb. 27, 2007, in the Korean Intellectual Property Office, the disclosure of which is incorporated by reference herein in its entirety.

FIELD OF THE INVENTION

The present invention relates to a method of fabricating semiconductor devices, and more particularly to methods of fabricating insulating films in semiconductor devices.

BACKGROUND OF THE INVENTION

Semiconductor devices typically include a plurality of elements, such as transistors, formed on a semiconductor substrate. In order to electrically isolate these elements, a film such as a spin on glass (SOG) film having relatively good gap-filling characteristics may be used. However, such a film may have a relatively high impurity density and/or a relatively high etching rate as-deposited. Therefore, a furnace annealing process performed at a relatively high temperature may be used to decrease an impurity concentration or impurity density within the film and/or to increase the etch resistance of the film.

However, the temperature of the furnace annealing process that may be required to achieve a suitable impurity density and/or etch resistance may be about 900° C. or higher. Thus, device characteristics may be degraded during such a furnace annealing process.

SUMMARY OF THE INVENTION

According to some embodiments of the present invention, a method of fabricating a semiconductor device includes forming a first device on a first semiconductor substrate. An interlayer insulating film is formed on the first device, and a second semiconductor substrate is formed on the interlayer insulating film such that the interlayer insulating film is between the first and second semiconductor substrates. Trenches are formed within the second semiconductor substrate, and a device isolating film is formed within the trenches. The device isolating film is irradiated with ultraviolet light having a wavelength configured to break chemical bonds of impurities in the device isolating film to reduce an impurity concentration thereof.

In some embodiments, the device isolating film may be a spin on glass (SOG) film, a flowable oxide (FOX) film, and/or a borophosphorsilicate glass (BPSG) film.

In other embodiments, the ultraviolet light may have a wavelength of greater than about 170 nanometers (nm). For example, the ultraviolet light may have a wavelength in a range of about 170 nm to about 380 nm, and in some embodiments, may have a wavelength in a range of about 300 nm to about 380 nm. The ultraviolet light in the range of about 170 nm to about 380 nm may be greater than about 5% of a total amount of light with which the device isolating layer is irradiated, and in some embodiments, the ultraviolet light in the range of about 300 nm to about 380 nm may be greater than about 10% of the total amount of light.

In some embodiments, the device isolating film may be irradiated at an ambient temperature in a range of about 200° C. to about 700° C. For example, the device isolating film may be irradiated at an ambient temperature in a range of about of 400° C. to about 600° C. The device isolating film may be irradiated in an ambient of at least one reactive vapor selected from a group consisting of $H_2O$, $O_2$, $O_3$, $N_2$, $NO$ and $NH_3$. A pressure of the reactive vapor may be in a range of about 100 torr to about 300 torr.

In other embodiments, the second semiconductor substrate having the device isolating film thereon may be thermally annealed before irradiating the device isolating film with the ultraviolet light. The thermal annealing may be performed at a temperature of about 700° C. or less.

In some embodiments, the first device may be a non-volatile memory device.

In other embodiments, before the trenches are formed, a tunnel insulating film, a floating gate film, and a hard mask film may be sequentially stacked on the second semiconductor substrate to define mask patterns thereon. The second semiconductor substrate may be etched using the mask patterns as an etch mask to form the trenches.

In some embodiments, the device isolating film may be a second device isolating film. A first device isolating film may be formed on the first substrate and thermally annealed to reduce an impurity concentration thereof prior to forming the interlayer insulating film.

In other embodiments, the device isolating film may be irradiated with ultraviolet light configured to break Si—H, Si—C, Si—N, N—H, C—C, C—H, and/or O—H bonds within the device isolating film. The device isolating film may be further irradiated with ultraviolet light configured to maintain Si—O bonds within the device isolating film in an unbroken state.

In some embodiments, the device isolating film may be a spin-on glass (SOG) film. The SOG film may be irradiated with the ultraviolet light in an ambient of $H_2O$ and/or $O_2$ to break Si—N bonds therein and to form Si—O bonds therein.

According to other embodiments of the present invention, a method of fabricating a semiconductor device includes forming trenches within a semiconductor substrate. A device isolating film is formed within the trenches. The device isolating film is irradiated with ultraviolet light having a wavelength greater than about 170 nanometers (nm).

According to still other embodiments of the present invention, a method of fabricating a semiconductor device includes forming a first device on a first semiconductor substrate. An interlayer insulating film is formed on the first device, and a second semiconductor substrate is formed on the interlayer insulating film such that the interlayer insulating film is between the first and second semiconductor substrates. Trenches are formed within the second semiconductor substrate, and a device isolating film is formed within the trenches. The device isolating film is irradiated with ultraviolet light having a wavelength greater than about 170 nanometers (nm).

DETAILED DESCRIPTION OF EMBODIMENTS OF THE INVENTION

Figure 1A:
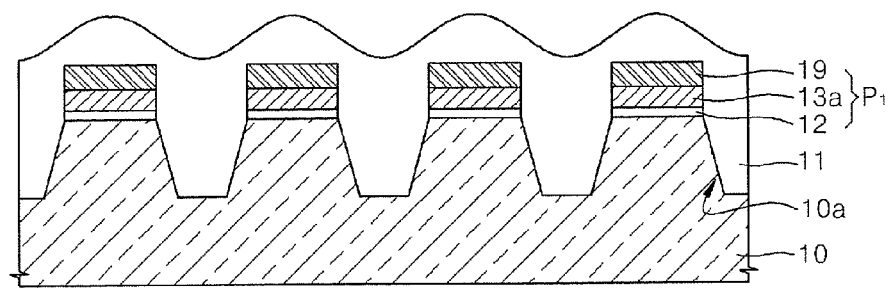
FIGS. 1A through 1C are cross-sectional views illustrating methods of fabricating a semiconductor device according to some embodiments of the present invention.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on" "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 1B:
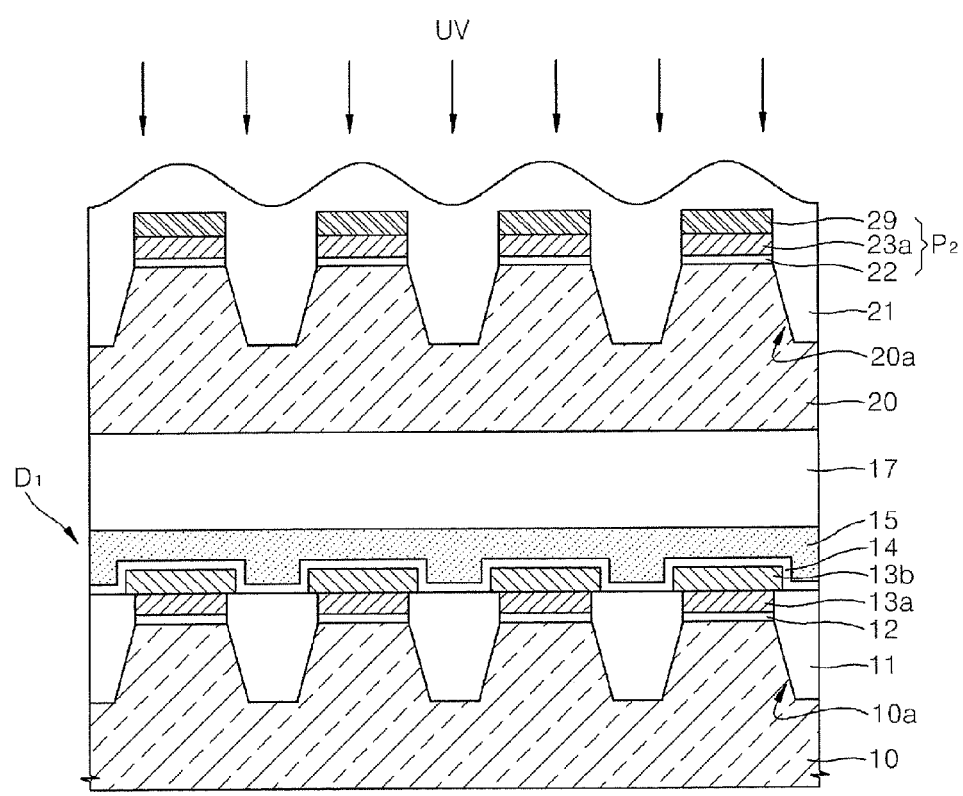
Figure 1C:
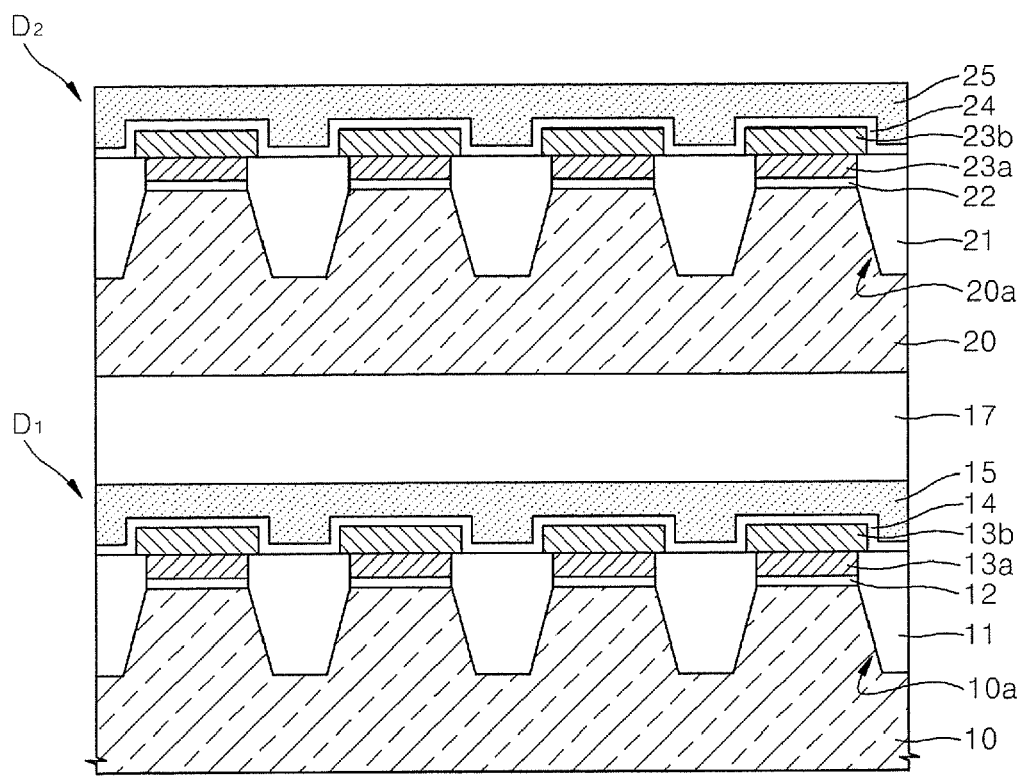

FIGS. 1A through 1C are cross-sectional views illustrating methods of fabricating a semiconductor device according to some embodiments of the present invention.

Referring to FIG. 1A, lower mask patterns $P_1$ are formed on a lower semiconductor substrate 10. The lower semiconductor substrate 10 is etched using the lower mask patterns $P_1$ as a etch mask, so that lower trenches 10a are formed in the lower semiconductor substrate 10 to define active regions. The lower mask patterns $P_1$ may be formed by sequentially stacking a lower tunnel insulating film 12, a first lower floating gate film 13a and a lower hard mask film 19.

A lower device isolating film 11 is formed on the substrate 10 in which the lower trenches 10a are formed. The formation of the lower device isolating film 11 will be described in detail below. In some embodiments, before forming the lower device isolating film 11, a sidewall insulating film (not shown) may be formed on sidewalls exposed within the lower trenches 10a.

Referring to FIG. 1B, the lower device isolating film 11 is planarized until the lower hard mask films 19 are exposed. Then, the lower hard mask films 19 are removed to expose the first lower floating gate films 13a.

Second lower floating gate films 13b are formed on the exposed first lower floating gate films 13a, and then patterned. As a result, a lower floating gate including the first lower floating gate film 13a and the second lower floating gate film 13b is formed.

An intergate dielectric film 14 is formed on the lower floating gate. A control gate film 15 is formed on the intergate dielectric film 14, and then patterned to define a lower control gate 15. Using the lower control gate 15 as an implantation mask, n-type and/or p-type impurities are implanted into the lower semiconductor substrate 10 to form source/drain regions (not shown). As a result, a lower device layer $D_1$ including lower non-volatile memory devices is formed.

An interlayer insulating film 17 is formed on the lower device layer $D_1$. An upper semiconductor substrate 20 is stacked on the interlayer insulating film 17. The upper semiconductor substrate 20 may be a thin single-crystalline substrate. The upper semiconductor substrate 20 and the interlayer insulating film 17 may be attached to each other by an appropriate adhesive.

After forming upper mask patterns $P_2$ on the upper semiconductor substrate 20, the upper semiconductor substrate 20 is etched using the upper mask patterns $P_2$ as a etch mask to form upper trenches 20a within the upper semiconductor substrate 20. The upper mask patterns $P_2$ may be formed by sequentially stacking an upper tunnel insulating film 22, a first upper floating gate film 23a and an upper hard mask film 29.

An upper device isolating film 21 is formed on the substrate 20 in which the upper trenches 20a are already formed. The upper device isolating film 21 may be, for example, a spin on glass (SOG) film, a flowable oxide (FOX) film and/or a borophosphorsilicate glass (BPSG) film, and may be formed by a chemical vapor deposition (CVD) process including plasma CVD, thermal CVD, photon CVD and/or flowable CVD or coating.

Thereafter, the upper device isolating film 21 is irradiated with ultraviolet (UV) light, also referred to herein as ultraviolet rays (indicated by the arrows in FIG. 1B). More particularly, ultraviolet rays are irradiated onto the upper device isolating film 21 so as to UV-anneal the upper device isolating film 21. The ultraviolet light has a wavelength in a range that is configured to break chemical bonds of impurities in the upper device isolating film 21. In particular, the ultraviolet rays may have a wavelength of greater than about 170 nm. For example, the ultraviolet rays may have a wavelength in the range of about 300 nanometers (nm) to about 380 nm. An intensity of UV light having a wavelength less than about 380 nm may be greater than about 5% of the total amount of light with which the upper device isolating film 21 is irradiated in some embodiments, and light having a relatively broad wavelength from about 300 nm to about 380 nm may be greater than about 10% of the total amount of light in other embodiments. Also, the ultraviolet rays may be irradiated at an ambient temperature in a range of about 200 degrees Celsius (° C.) to about 700° C., for example, about 400° C. to about 600° C. The intensity of the ultraviolet rays may be greater than about 2 kW, and at least one lamp can be used.

When annealing the upper device isolating film 21 using the ultraviolet rays, the chemical bonds of impurities in the upper device isolating film 21, such as Si—H bonds, Si—C bonds, Si—N bonds, N—H bonds, O—H bonds, etc., within the upper device isolating film 21 may be broken. Therefore, at a relatively low temperature, the impurity concentration or impurity density within the upper device isolating film 21 can be decreased, and/or the upper device isolating film 21 can be made further compact. Additionally, widening of the junction regions, such as the source/drain regions formed within the lower device layer $D_1$ can be minimized and/or reduced.

The irradiation of the ultraviolet rays may be performed in a reactive vapor ambient, i.e., an ambient of at least one vapor selected from a group consisting of $H_2O$, $O_2$, $O_3$, $N_2$, NO and $NH_3$, for example. A pressure of the reactive vapor may be in the range of about 2 torr to about 700 torr, and in some embodiments, in the range of about 100 torr to about 300 torr. The reactive vapor may be activated by the ultraviolet rays, and may react with the upper device isolating film 21 to make the upper device isolating film 21 further compact.

Before irradiating the ultraviolet rays onto the upper device isolating film 21, the upper device isolating film 21 may also be thermally annealed. The thermal annealing process can be performed at a relatively low temperature, for example, at about 700° C. If both the thermal annealing process at the relatively low temperature and the UV-annealing according to some embodiments of the present invention are performed, the impurity density within the upper device isolating film 21 may be further decreased, and/or the upper device isolating film 21 can be made more compact.

Also, in some embodiments, before forming the upper device isolating film 21, an upper sidewall insulating film (not shown) may be formed on sidewalls exposed within the upper trenches 20a.

In some embodiments, the lower device isolating film 11 can also be formed in a manner similar to the forming of the upper device isolating film 21 described above. However, since the lower device isolating film 11 may be formed prior to forming elements on the lower substrate 10, curing can be performed solely by thermal annealing at a high temperature without using UV-annealing in other embodiments. The lower device isolating film 11 may be formed by high density plasma chemical vapor deposition (HDP-CVD).

Referring to FIG. 1C, the upper device isolating film 21 is planarized until the upper hard mask films 29 are exposed. Then, the upper hard mask films 29 are removed, and the first upper floating gate films 23a are exposed.

Second upper floating gate films 23b are formed on the exposed first upper floating gate films 23a, and the second upper floating gate film 23b are patterned. As a result, an upper floating gate including the first upper floating gate film 23a and the second upper floating gate film 23b is formed.

An upper intergate insulating film 24 is formed on the upper floating gate. An upper control gate film is formed on the upper intergate insulating film 24, and then patterned to define an upper control gate 25. Using the upper control gate 25 as a implantation mask, n-type and/or p-type impurities are implanted into the upper semiconductor substrate 20, so that source/drain regions (not shown) are formed. As a result, an upper device layer $D_2$ including upper non-volatile memory devices is formed.

Figure 2:
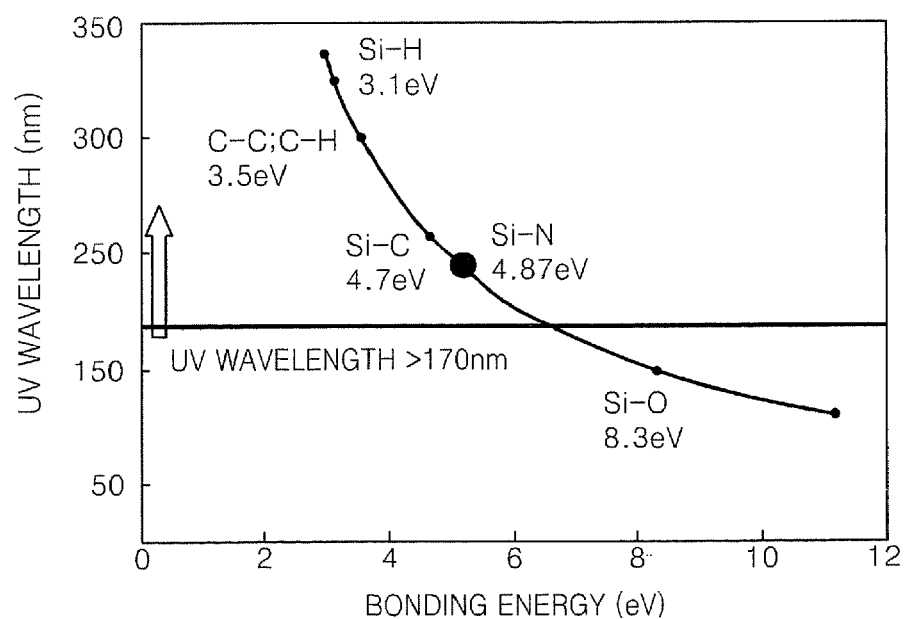
FIG. 2 is a graph illustrating a relationship between bonding energy of chemical bonds within an insulating film versus a wavelength of ultraviolet rays used to irradiate the film according to some embodiments of the present invention.

FIG. 2 is a graph illustrating a relationship between the bonding energy of the chemical bonds within an isolating film versus a wavelength of the ultraviolet rays used to irradiate the film according to some embodiments of the present invention. Referring to FIG. 2, if the wavelength of the ultraviolet rays is greater than about 170 nm, the impurity bonds such as the Si—H bonds, the C—C bonds, the C—H bonds, the Si—C bonds and/or the Si—N bonds within the insulating film can be broken. However, even though the wavelength of the ultraviolet rays may be greater than about 170 nm, the Si—O bonds within the insulating film may not be broken, and as such, may be maintained in an unbroken state.

Figure 3:
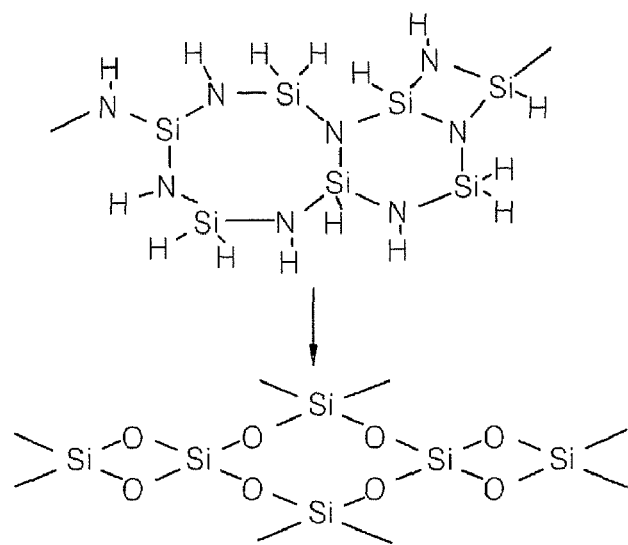
FIG. 3 is a diagram illustrating a reaction of a spin on glass (SOG) film before and after irradiation with ultraviolet rays in accordance with some embodiments of the present invention.

FIG. 3 is a diagram illustrating the chemical structure of a SOG film before and after being irradiated with the ultraviolet rays according to some embodiments of the present invention. In this case, the SOG film was a polysilazane-based film, and UV irradiation was performed at a $H_2O$ ambient and an $O_2$ ambient. As shown in FIG. 3, the Si—N bonds within the SOG film were broken and the Si—O bonds were produced.

Figure 4:
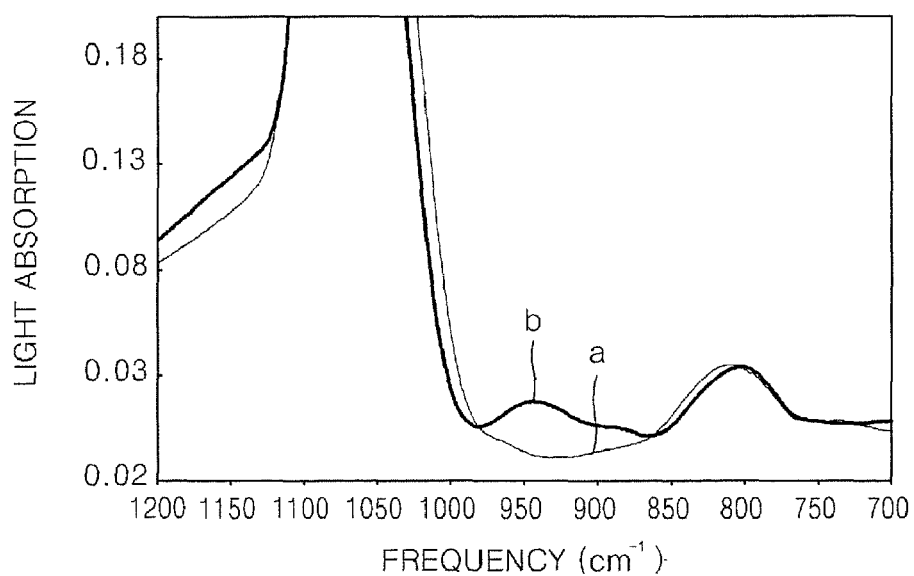
FIG. 4 is a graph illustrating results of analyzing an SOG film before and after irradiation with ultraviolet rays in accordance with some embodiments of the present invention using Fourier Transformation InfraRed (FTIR) spectroscopy.

FIG. 4 is a graph illustrating results of analyzing the SOG film before and after irradiation with the ultraviolet rays according to some embodiments of the present invention, using Fourier Transformation InfraRed (FTIR) spectroscopy. In this case, UV irradiation was performed under conditions where the intensity of the light having a relatively broad width within a wavelength range of about 300 nm to about 380 nm represented greater than about 10% of the total amount of light to which the SOG film was exposed at a temperature of about 500° C. Referring to FIG. 4, an SOG film (a) after the UV irradiation has relatively few impurities detected around 950 $cm^{-1}$ as compared with an SOG film (b) before the UV irradiation. Therefore, curing of the SOG film can be performed at a relatively low temperature of about 500° C.

According to some embodiments of the present invention, ultraviolet rays are irradiated onto an upper device isolating film formed within an upper semiconductor substrate, so that the upper device isolating film is cured. Thus, widening of junction regions, such as source/drain regions formed within a lower device layer, may be reduced and/or minimized. Furthermore, an impurity concentration or density within the upper device isolating film may be decreased, and the upper device isolating film can be made more compact.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of fabricating a semiconductor device, the method comprising:
   forming a first device on a first semiconductor substrate;
   forming an interlayer insulating film on the first device;
   forming a second semiconductor substrate on the interlayer insulating film such that the interlayer insulating film is between the first and second semiconductor substrates;
   forming trenches within the second semiconductor substrate;
   forming a device isolating film within the trenches; and
   irradiating the device isolating film with ultraviolet light having a wavelength configured to break chemical bonds of impurities in the device isolating film to reduce an impurity concentration thereof.

2. The method of claim 1, wherein the device isolating film comprises a spin on glass (SOG) film, a flowable oxide (FOX) film, or a borophosphorsilicate glass (BPSG) film.

3. The method of claim 1, wherein the ultraviolet light has a wavelength of greater than about 170 nanometers (nm).

4. The method of claim 1, wherein the device isolating film is irradiated at an ambient temperature in a range of about 400 degrees Celsius (° C.) to about 600° C.

5. The method of claim 1, further comprising thermally annealing the device isolating film before irradiating the upper device isolating film.

6. The method of claim 1, wherein the first device comprises a non-volatile memory device.

7. The method of claim 1, wherein irradiating the device isolating film comprises irradiating the device isolating film with ultraviolet light configured to break Si—H, Si—C, Si—N, N—H, C—C, C—H, and/or O—H bonds within the device isolating film.

8. The method of claim 3, wherein the ultraviolet light has a wavelength in a range of about 170 nm to about 380 nm.

9. The method of claim 8, wherein the ultraviolet light in the range of about 170 nm to about 380 nm comprises greater than about 5% of a total amount of light with which the device isolating film is irradiated.

10. The method of claim 8, wherein the ultraviolet light has a wavelength in a range of about 300 nm to about 380 nm.

11. The method of claim 10, wherein the ultraviolet light in the range of about 300 nm to about 380 nm comprises greater than about 10% of a total amount of light with which the device isolating film is irradiated.

12. The method of claim 5, wherein the thermal annealing is performed at a temperature of about 700° C. or less.

13. The method of claim 7, wherein irradiating the device isolating film further comprises irradiating the device isolating film with ultraviolet light configured to maintain Si—O bonds within the device isolating film in an unbroken state.

14. A method of fabricating a semiconductor device, the method comprising:
   forming trenches within a semiconductor substrate;
   forming a device isolating film within the trenches; and
   irradiating the device isolating film with ultraviolet light having a wavelength greater than about 170 nanometers (nm).

15. The method of claim 14, wherein the ultraviolet light has a wavelength in a range of about 170 nm to about 380 nm.

16. The method of claim 15, wherein the ultraviolet light has a wavelength in a range of about 300 nm to about 380 nm.

17. A method of fabricating a semiconductor device, the method comprising:
   forming a first device on a first semiconductor substrate;
   forming an interlayer insulating film on the first device;
   forming a second semiconductor substrate on the interlayer insulating film such that the interlayer insulating film is between the first and second semiconductor substrates;
   forming trenches within the second semiconductor substrate;
   forming a device isolating film within the trenches; and
   irradiating the device isolating film with ultraviolet light having a wavelength greater than about 170 nanometers (nm).

18. The method of claim 17, wherein the ultraviolet light has a wavelength in a range of about 170 nm to about 380 nm.

19. The method of claim 18, wherein the ultraviolet light has a wavelength in a range of about 300 nm to about 380 nm.

* * * * *